US008895450B2

(12) United States Patent
Cao et al.

(10) Patent No.: US 8,895,450 B2
(45) Date of Patent: Nov. 25, 2014

(54) LOW RESISTIVITY TUNGSTEN PVD WITH ENHANCED IONIZATION AND RF POWER COUPLING

(71) Applicant: Applied Materials, Inc., Santa Clara, CA (US)

(72) Inventors: Yong Cao, San Jose, CA (US); Xianmin Tang, San Jose, CA (US); Srinivas Gandikota, Santa Clara, CA (US); Wei D. Wang, San Jose, CA (US); Zhendong Liu, Tracy, CA (US); Kevin Moraes, Fremont, CA (US); Muhammad M. Rasheed, San Jose, CA (US); Thanh X. Nguyen, San Jose, CA (US); Ananthkrishna Jupudi, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/054,477

(22) Filed: Oct. 15, 2013

(65) Prior Publication Data
US 2014/0042016 A1      Feb. 13, 2014

Related U.S. Application Data

(63) Continuation of application No. 13/157,164, filed on Jun. 9, 2011, now Pat. No. 8,558,299.

(60) Provisional application No. 61/353,554, filed on Jun. 10, 2010.

(51) Int. Cl.
*H01L 21/302* (2006.01)
*H01L 21/461* (2006.01)
*H01L 21/28* (2006.01)
*C23C 14/35* (2006.01)
*H01L 21/285* (2006.01)
*C23C 14/34* (2006.01)
*H01L 29/49* (2006.01)
*C23C 14/16* (2006.01)
*H01L 29/78* (2006.01)
*H01L 29/51* (2006.01)

(52) U.S. Cl.
CPC .......... *H01L 21/28079* (2013.01); *H01L 29/78* (2013.01); *H01L 21/28088* (2013.01); *C23C 14/35* (2013.01); *H01L 29/517* (2013.01); *H01L 21/2855* (2013.01); *C23C 14/345* (2013.01); *H01L 29/4966* (2013.01); *C23C 14/165* (2013.01)
USPC ....................... 438/706; 438/732; 204/192.12

(58) Field of Classification Search
USPC .......................... 438/685, 706, 707, 710, 732; 204/192.12, 192.13, 298.16
See application file for complete search history.

(56) References Cited

U.S. PATENT DOCUMENTS 4,570,328 A   2/1986 Price et al.
4,605,947 A   8/1986 Price et al.
(Continued)

OTHER PUBLICATIONS

International Search Report for International Application No. PCT/US2011/039867 dated Feb. 27, 2012.

*Primary Examiner* — Phuc Dang
(74) *Attorney, Agent, or Firm* — Patterson & Sheridan, LLP

(57) ABSTRACT

Embodiments described herein provide a semiconductor device and methods and apparatuses of forming the same. The semiconductor device includes a substrate having a source and drain region and a gate electrode stack on the substrate between the source and drain regions. In one embodiment, the method includes positioning a substrate within a processing chamber, wherein the substrate includes a source and drain region, a gate dielectric layer between the source and drain regions, and a conductive film layer on the gate dielectric layer. The method also includes depositing a refractory metal nitride film layer on the conductive film layer, depositing a silicon-containing film layer on the refractory metal nitride film layer, and depositing a tungsten film layer on the silicon-containing film layer.

13 Claims, 8 Drawing Sheets

(56) References Cited

U.S. PATENT DOCUMENTS

| | | | |
|---|---|---|---|
| 5,824,158 A * | 10/1998 | Takeuchi et al. | 118/723 IR |
| 6,440,261 B1 | 8/2002 | Tepman et al. | |
| 8,263,499 B2 * | 9/2012 | Honda et al. | 438/706 |
| 8,558,299 B2 | 10/2013 | Cao et al. | |
| 2002/0029093 A1 | 3/2002 | Miller et al. | |
| 2004/0055880 A1 | 3/2004 | Gung et al. | |
| 2005/0023620 A1 | 2/2005 | Iyer | |
| 2006/0024959 A1 | 2/2006 | Li et al. | |
| 2007/0178681 A1 | 8/2007 | Chung et al. | |
| 2007/0202706 A1 | 8/2007 | Mui et al. | |
| 2008/0196661 A1 | 8/2008 | West | |
| 2008/0242072 A1 | 10/2008 | Choi et al. | |
| 2009/0087585 A1 | 4/2009 | Lee et al. | |
| 2010/0192855 A1 | 8/2010 | Yuasa et al. | |

\* cited by examiner

LOW RESISTIVITY TUNGSTEN PVD WITH ENHANCED IONIZATION AND RF POWER COUPLING

CROSS-REFERENCE TO RELATED APPLICATIONS

This application is a continuation of U.S. patent application Ser. No. 13/157,164, filed Jun. 9, 2011, now U.S. Pat. No. 8,558,299, which claims benefit of U.S. Provisional Patent Application Ser. No. 61/353,554, filed Jun. 10, 2010. Each of the aforementioned related patent applications is herein incorporated by reference.

BACKGROUND OF THE INVENTION

1. Field of the Invention

Embodiments of the present invention generally relate to methods and an apparatus of forming integrated circuits. More particularly, embodiments of the invention relate to methods and an apparatus for forming a gate electrode and associated layers.

2. Description of the Related Art

Integrated circuits may include more than one million micro-electronic devices such as transistors, capacitors, and resistors. One type of integrated circuit are field effect transistors (e.g., metal-oxide-semiconductor field effect transistors (MOSFET or MOS)) that are formed on a substrate (e.g., a semiconductor substrate) and cooperate to perform various functions within the circuit. A MOSFET transistor comprises a gate structure disposed between source and drain regions that are formed in the substrate. The gate structure generally comprises a gate electrode and a gate dielectric. The gate electrode is disposed over the gate dielectric to control a flow of charge carriers in a channel region formed between the drain and source regions beneath the gate dielectric. To increase the speed of the transistor, the gate may be formed from materials that lower the resistivity of the gate.

The gate dielectric layer may be formed of dielectric materials such as silicon dioxide ($SiO_2$), or a high-k dielectric material having a dielectric constant greater than 4.0, such as SiON, SiN, hafnium oxide ($HfO_2$), hafnium silicate ($HfSiO_2$), hafnium silicon oxynitride (HfSiON), zirconium oxide ($ZrO_2$), zirconium silicate ($ZrSiO_2$), barium strontium titanate ($BaSrTiO_3$, or BST), lead zirconate titanate ($Pb(ZrTi)O_3$, or PZT), and the like. It should be noted, however, that the film stack may comprise layers formed of other materials.

Gate stacks may also incorporate metal layers formed on the high-k dielectric and on a polysilicon layer on the high-k dielectric. The metal layers may include Ti, TiN, W, WN, $WSi_xN_y$ or other metals.

Tungsten (W) may be particularly useful in gate electrodes and word and bit lines in DRAM types of integrated circuit devices because of its thermal stability during subsequent high temperature processes, where processing temperatures may reach 900° C. or more. Additionally, tungsten is a highly refractive material which offers good oxidation resistance and also lower resistivity. Melted, refined tungsten in bulk form typically has a resistivity of 5.5 µohms-cm. However, when tungsten is formed in thin films (e.g. less than 400 Å), the resistivity may be between 11-15 µohms-cm. For example, tungsten films formed using past PVD technology typically have a resistivity of 11-11.5 µohms-cm, whereas tungsten films formed using CVD technology typically have a resistivity of 13-15 µohms-cm.

Additionally, when thin film tungsten is combined with other materials such as WNi or TiN, the sheet resistance ($R_s$) of the gate stack may jump very high. For example, a gate electrode stack of W/WN on polysilicon (poly) or $W/WSi_xN_y$ on poly may have an $R_s$ between 20-25 µohms-cm. In other examples, a gate stack of W/WN/Ti on poly may have an $R_s$ of 15 µohms-cm or more and a gate of W/TiN may have an $R_s$ as high as 30-40 µohms-cm. Lowering the sheet resistance of the gate electrode stack, may allow decreased dielectric thicknesses, reduced heights of the gate and distances between gate and bit lines, thereby improving overall switching speed of the gate electrode.

In conventional MOS fabrication schemes, the substrate is required to pass between tools having the various reactors coupled thereto. The process of passing the substrate between tools necessitates the removal of the substrate from the vacuum environment of one tool for transfer at ambient pressures to the vacuum environment of a second tool. In the ambient environment, the substrates are exposed to mechanical and chemical contaminants, such as particles, moisture, and the like, that may damage the gate structures being fabricated and possibly form an undesired interfacial layer, e.g., native oxide, between each layer while transferring. As gate structures become smaller and/or thinner to increase the device speed, the detrimental effect of forming interfacial layers or contamination becomes an increased concern. Additionally, the time spent on transferring the substrate between the cluster tools decreases productivity in manufacture of the field effect transistors. Plus, advances in the reduction of critical dimension (CD) geometries of integrated circuits have also created a high demand for improved material properties.

Thus, although tungsten is a useful metal for gate electrodes, decreasing the resistance of tungsten further may help to improve gate electrode stack performance and modify the gate electrode materials to decrease the overall resistivity of the entire gate electrode stack. Therefore, there is a need in the art for methods and an apparatus for forming a gate stack that has improved properties.

SUMMARY OF THE INVENTION

In one embodiment of the invention, a semiconductor device is disclosed. The semiconductor device includes a substrate having a source and drain region and a gate electrode stack on the substrate between the source and drain regions. The gate electrode stack includes a conductive film layer on a gate dielectric layer, a refractory metal nitride film layer on the conductive film layer, a silicon-containing film layer on the refractory metal nitride film layer, and a tungsten film layer on the silicon-containing film layer.

In another embodiment of the invention, a method of forming a gate electrode stack is disclosed. The method includes positioning a substrate within a processing chamber, wherein the substrate includes a source and drain region, a gate dielectric layer between the source and drain regions, and a conductive film layer on the gate dielectric layer. The method also includes depositing a refractory metal nitride film layer on the conductive film layer, depositing a silicon-containing film layer on the refractory metal nitride film layer, and depositing a tungsten film layer on the silicon-containing film layer.

In another embodiment of the invention, a method for depositing tungsten thin film is disclosed. The method includes forming a plasma in a processing region of a chamber using an RF or DC power supply coupled to a target in the chamber, the target having a first surface that is in contact with the processing region of the chamber and a second surface that is opposite the first surface and delivering energy to a plasma formed in a processing region of a chamber, wherein delivering energy includes delivering RF power from an RF power supply to a target or delivering DC power from a DC power supply to the target. The method also includes rotating a magnetron about the center point of the target, wherein the magnetron is disposed adjacent the second surface of the target, the magnetron including an outer pole including a plurality of magnets and an inner pole including a plurality of magnets, wherein the outer and inner poles form a closed-loop magnetron assembly and wherein the ratio of the magnetic fields generated by the outer and inner poles is between about 1.56 and about 0.57. Further, the method includes heating a substrate support in the chamber, biasing the substrate support with an RF power supply, and depositing a tungsten film layer on a substrate positioned on the substrate support in the chamber.

In another embodiment of the invention, a plasma processing chamber is disclosed. The processing chamber includes a target having a first surface that is in contact with a processing region and a second surface that is opposite the first surface, an RF or DC power supply coupled to the target, a grounded, heated shield that at least partially encloses a portion of the processing region and is electrically coupled to a ground, and a substrate support having a substrate receiving surface disposed below the target, the substrate support further including an electrode disposed below the substrate receiving surface. The processing chamber also includes a cover ring, a deposition ring disposed over a portion of the substrate support, wherein during processing the cover ring is disposed on a portion of the deposition ring, and a pedestal grounding assembly disposed below the substrate support including a plate having a U-shaped portion that extends between a substrate support assembly and a ring support portion of the grounded shield. Further, the processing chamber also includes a magnetron disposed adjacent to the second surface of the target, wherein the magnetron includes an outer pole including a plurality of magnets and an inner pole including a plurality of magnets, wherein the outer and inner poles form a closed-loop magnetron assembly, wherein the outer pole and the inner pole each create a magnetic field, wherein the ratio of the magnetic fields generated by the outer and inner poles is between about 1.56 and about 0.57.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized in other embodiments without specific recitation.

DETAILED DESCRIPTION

The invention generally provides a gate electrode stack structure having a reduced sheet resistance ($R_s$) and methods and apparatuses of forming the same. In one embodiment, the gate electrode stack structure may be formed for a memory type semiconductor device, such as a DRAM type integrated circuit.

Figure 1A:
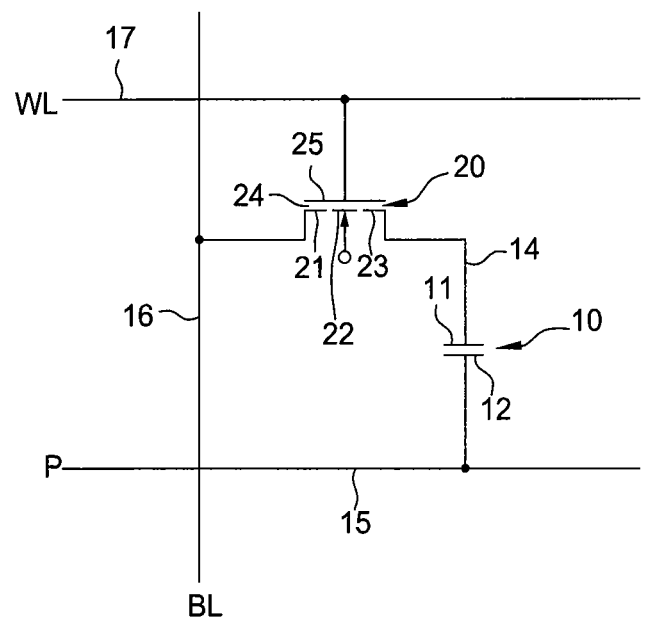
FIG. 1A illustrates a circuit diagram of a dynamic memory cell in a DRAM memory.

Turning now to FIG. 1A, a circuit diagram of a one transistor cell such as may be used in DRAM memories is illustrated. The one transistor memory cell comprises a storage capacitor 10 and a selection transistor 20. In this case, the selection transistor 20 is formed as a field effect transistor and has a first source/drain electrode 21 and a second source/drain electrode 23 between which an active region 22 is arranged. Above the active region 22 are the gate insulating layer or dielectric layer 24 and gate electrode 25, together which act like a plate capacitor and can influence the charge density in the active region 22 in order to form or block a current conducting channel between the first source/drain electrode 21 and the second/source electrode 23.

The second source/drain electrode 23 of the selection transistor 20 is connected to a first electrode 11 of the storage capacitor 10 via a connecting line 14. A second electrode 12 of the storage capacitor 10 is in turn connected to a capacitor plate 15 which may be common to storage capacitors of the DRAM memory cell arrangement. The first electrode 21 of the selection transistor 20 is furthermore connected to a bit line 16 in order that the information stored in a storage capacitor 10 in the form of charges can be written in and read out. In this case the write in or read out operation is controlled via a word line 17 which is connected to the gate electrode 25 of the selection transistor 20. The write in or read out operation occurs by applying a voltage to produce a current conducting channel in the active region 22 between the first source/drain electrode 21 and the second source/drain electrode 23.

Different types of capacitors may be used as the capacitor 10 in DRAM type memory cells such as trench capacitors, stacked capacitors, and planar capacitors. With increasing miniaturization of the DRAM type memory cells and as ever decreasing cross-sections of the trench capacitor, additional measures are necessary in order to provide a reduced RC time constant of a circuit e.g. a MOS device of a DRAM type memory cell. The RC time constant is the time required to charge the capacitor through the resistor to a percentage of full charge or to discharge it to a percent of its initial voltage. The RC time constant is equal to the product of the circuit resistance and the circuit capacitance. The gate electrode is one contributor to the circuit resistance. Thus, one way to reduce the RC time constant of a MOS device in a DRAM type memory cell may be to reduce the resistance of the gate electrode.

Figure 1B:
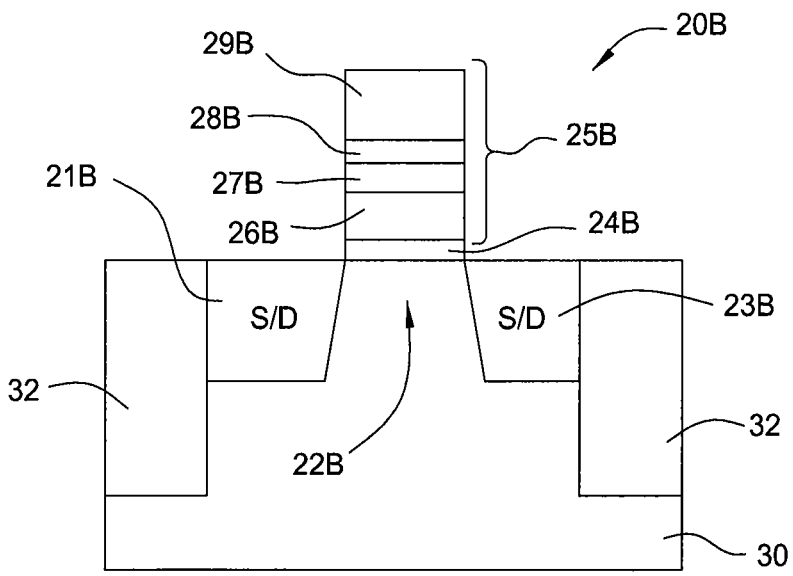
FIG. 1B illustrates a gate electrode stack according to one embodiment of the invention.

FIG. 1B illustrates a gate electrode stack 25B of a MOS device 20B that may be used in a DRAM type memory cell, such as the selection transistor 20 of FIG. 1A. The semiconductor device such as MOS device 20B is formed on a substrate 30. The substrate may be formed from any type of semiconductor material such as silicon, germanium, etc. The MOS device 20B includes source and drain regions 21B and 23B on the substrate 30. The source and drain regions 21B and 23B may be formed by doping the substrate 30 using conventional doping techniques. The area below the gate electrode stack 25B may be a lightly doped region 22B of the substrate 30, where the dopant has a different conductivity than the dopant used to form the source and drain regions 21B, 23B. Additionally, shallow trench isolation regions 32 may also be formed on the substrate 30.

The gate electrode stack 25B is formed between the source and drain regions 21B and 23B. A gate dielectric layer 24B may be formed on the area of the substrate above the lightly doped region 22B. The gate dielectric layer may be made from various dielectric materials, including low-k dielectric materials, to insulate the gate from the substrate 30. On the gate dielectric layer 24B is a conductive film layer 26B that forms part of the gate electrode stack 25B. The conductive film layer 26B may be polysilicon or other types of conductive films used for gate electrode stacks. The gate electrode stack 25B also includes a refractory metal nitride film layer 27B on the conductive film layer 26B. Refractory metal nitride films may include titanium nitride (TiN), tungsten nitride (WN), as well as nitrides of other refractory metals such as zirconium, hafnium, tantalum, vanadium, chromium to name a few. The refractory metal film layer may have a thickness from about 50 Å to about 150 Å. In one embodiment, the refractory metal film layer thickness is about 100 Å.

A silicon-containing film layer 28B is formed on the refractory metal nitride film layer 27B. The silicon-containing film may be a thin film of silicon deposited using various techniques, such as PVD, CVD, and ALD techniques. The silicon-containing film layer may include a dopant, such as boron. In one embodiment, the silicon-containing film layer may be a tungsten silicide film. The silicon-containing film layer may have a thickness of about 10 Å to 30 Å, such as 20 Å. The gate electrode stack 25B also includes a tungsten film 29B layer on the silicon-containing film layer 28B. Tungsten may be in an alpha or beta phase. In one embodiment, the thin film of tungsten 29B may be formed in an alpha phase, which helps reduce the resistance of tungsten. The tungsten film layer may have a thickness from about 450 Å to 550 Å. In one embodiment, the tungsten film layer has a thickness of about 500 Å. In one embodiment, the tungsten film layer may have a resistance of less then 10 μohms-cm. In one embodiment, the tungsten film layer may have a resistance of less than 9.5 μohms-cm. In one embodiment, the tungsten film layer has a resistance of 9.15 μohms-cm.

The gate electrode stack may have a thickness from about 450 Å to 650 Å. The $R_s$ of the gate electrode stack may be between about 10 μohms-cm and 14 μohms-cm, such as between 11 to 12 μohms-cm. In one embodiment, the $R_s$ of the gate electrode stack may be about 11.5 μohms-cm. The gate electrode stack having a layer of silicon interposed between the tungsten and refractory metal nitride layers thus reduces the $R_s$ by as much as 50%-60% compared to other types of gate electrode stacks.

A gate electrode stack formed from WN or WSiN on polysilicon may react with the polysilicon during or after deposition, thereby forming an insulating layer between the metal layers and polysilicon. This insulating layer may be especially prone to form during subsequent high temperature processing. Additionally, during WN deposition reactive nitrogen plasma used may react with polysilicon or the native oxide on polysilicon and form silicon nitride (SiN), one type of insulating layer. Additionally, in the case of a W/AN/Ti on poly gate stack, Ti is very reactive and getters oxide on polysilicon, forming TiSiN or $TiO_xN_y$ during subsequent thermal processing. Thus, interposing the silicon-containing film layer 28B between the tungsten film layer 29B and refractory metal nitride film layer 27B may help overcome these drawbacks to other types of gate electrode stacks.

Processing Details

Figure 2:
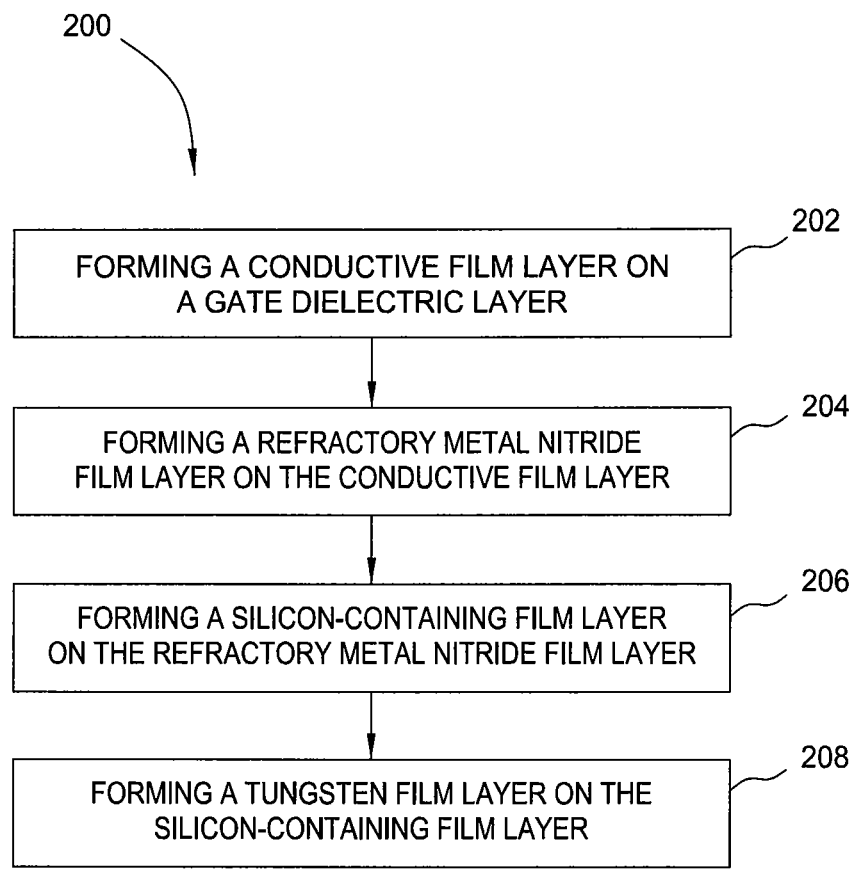
FIG. 2 illustrates a process diagram of a method of forming a gate electrode stack according to one embodiment of the invention.

FIG. 2 depicts a flow chart illustrating process 200 for forming a gate electrode stack, as described in an embodiment herein. The process 200 may include forming a conductive film layer on a gate dielectric layer, process 202. The method may also include positioning a substrate within a processing chamber, wherein the substrate comprises a source and drain region, a gate dielectric layer between the source and drain regions, and a conductive film layer on the gate dielectric layer. A refractory metal nitride film layer may be formed on the conductive film layer as in process 204. In process 206, a silicon-containing film layer is formed on the refractory metal nitride film layer. The process 200 may also include forming a tungsten film layer on the silicon-containing film layer, as in process 208.

Figure 3:
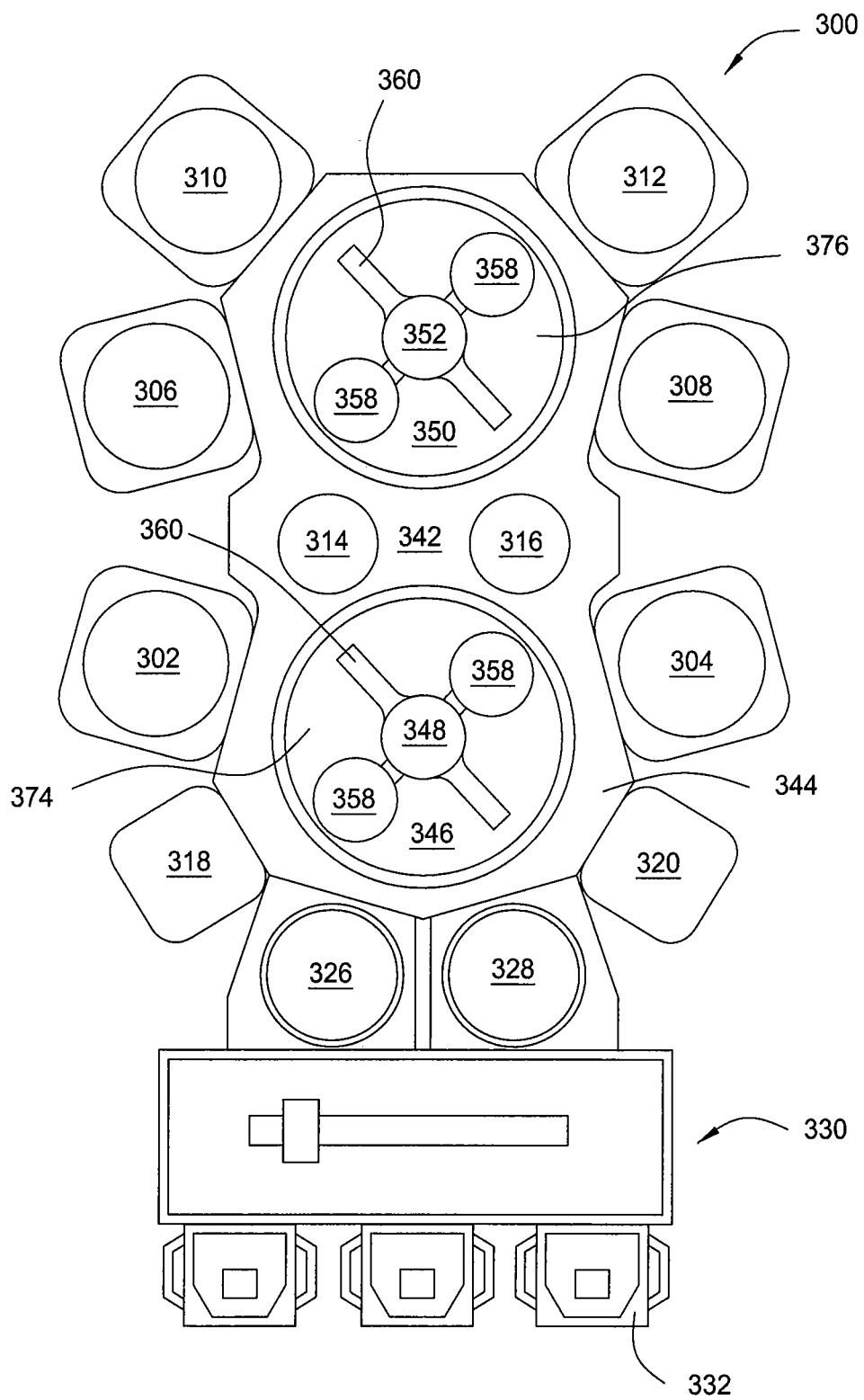
FIG. 3 illustrates a platform system having multiple chambers for forming a gate electrode stack according to one embodiment of the invention.

In one embodiment, formation of the refractory metal nitride film layer, the silicon-containing film layer, and the tungsten film layer are all formed in-situ, such as in a processing system 300 as illustrated in FIG. 3 and described below. In another embodiment, the films are formed in separate processing systems, where a vacuum break occurs between formation of some of the film layers. In other words, formation of the various films layers may be formed ex-situ. For example, the silicon-containing film may be formed in a different processing system than the tungsten film layer. Thus, some of the silicon-containing film may be exposed to oxygen whereby a layer of native oxide is formed on the silicon-containing layer, such as $SiO_2$. In one embodiment, the native oxide film is removed and the silicon-containing layer cleaned prior to formation of the tungsten film layer.

In process 202, a conductive film may be formed on a gate dielectric layer using conventional methods. For example, a gate oxide may be deposited on the substrate 30 using CVD techniques, followed by a depositing a polysilicon layer, also by CVD techniques. Prior to formation of the refractory metal nitride film layer, the substrate may be subjected to a preclean process and/or a degas process. For example, if the conductive film is a polysilicon layer, the Applied Materials Siconi™ Preclean process may be performed on the substrate for removing oxide from the polysilicon layer. The Siconi™ Preclean process removes native oxide through a low-temperature, two-step dry chemical clean process using $NF_3$ and $NH_3$.

In process 204, the refractory metal nitride film layer may be formed using a PVD process. For example, when forming a titanium nitride layer, a plasma may be generated with nitrogen gas and power supplied to a titanium target to deposit a titanium nitride film. In one embodiment, a titanium seed layer is first deposited on a poly layer to improve adhesion of the titanium nitride layer subsequently formed on the titanium seed layer. In one embodiment, a DC power source may be applied to the target and an RF bias may be applied to the substrate support during deposition of the titanium seed layer and the titanium nitride layer.

In process 206, a silicon-containing film layer may be formed using various techniques and methods. In one embodiment, a silicon-containing film may be deposited using a PVD process having an RF power source coupled to the target. The target may be a silicon target and a plasma generated from a non-reactive gas such as argon (Ar), krypton (Kr), etc. For example, a plasma may be generated from a non-reactive gas having a flow rate within a range from about 30 standard cubic centimeters (sccm) to about 60 sccm, such as about 40 sccm. An RF power may be applied to the target at a power level within a range from about 300 W to about 600 W, such as about 500 W. The deposition chamber may be pressurized from about 1.5 mTorr to about 4.5 mTorr, such 2.5 mTorr. The substrate may be electrically "floating" and have no bias.

In another embodiment, the plasma may be generated using a DC power source coupled to the target. Additionally, an RF power source may also be used to perform an RF clean of the chamber and the target after a certain number of cycles to prevent particles from forming on the shield or other areas of the chamber and contaminating subsequent films deposited in the chamber, and for removing native oxide that may form on the target. The substrate may be electrically "floating" and have no bias. In this embodiment, a plasma may be generated from an Ar gas having a flow rate within a range from about 30 sccm to about 60 sccm, such as about 40 sccm. An DC power may be applied to the target at a power level within a range from about 250 W to about 550 W, for example between about 300 W to about 500 W, such as about 400 W. The deposition chamber may be pressurized from about 1.5 mTorr to about 4.5 mTorr, such as 2.5 mTorr. In another embodiment, the silicon-containing layer may be formed using an ALD or CVD process. In both processes, silicon precursors are used to react and deposit a silicon-containing film on the substrate. In any of the techniques for forming a silicon-containing layer, the deposition rate may be between 0.30 Å/s to 0.80 Å/s. For example, the deposition rate using a DC power supply may be 0.58 Å/s, whereas using an RF power supply may be 0.43 Å/s. The thickness of the silicon-containing layer may be between about 10 Å and about 30 Å. In one embodiment, the silicon-containing layer may be about 20 Å thick. The sheet resistance of the gate electrode stack may vary depending on the thickness and technique used to depositing the silicon-containing layer. For example, experiments have indicated that a DC PVD technique for depositing silicon on a TiN layer in a gate electrode stack provides a better $R_s$ for the gate electrode stack than an RF PVD technique for depositing silicon.

Figure 4A:
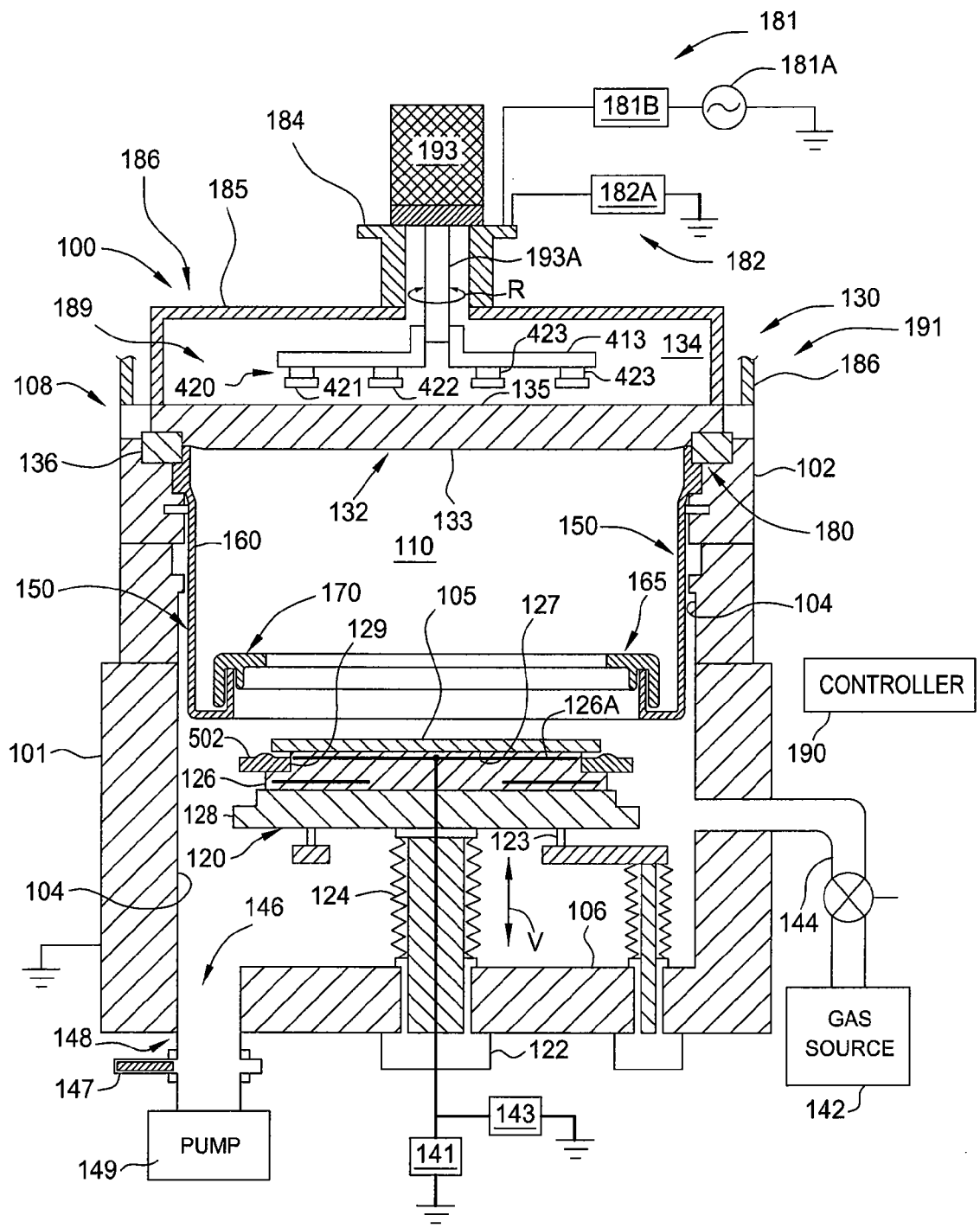
FIG. 4A illustrates a cross-sectional view of a chamber according to one embodiment of the invention.

During process 208, the tungsten film may be formed on the silicon-containing layer using various methods. Reference to FIGS. 4A-7 may be used to illustrate the process. In one embodiment, the method for forming the tungsten film includes forming a plasma in a processing region 110 of a chamber 100 using an RF power supply 181 or DC power supply 182 coupled to a tungsten target 132 in the chamber 100. The tungsten target 132 has a first surface 133 that is in contact with the processing region 110 of the chamber 100 and a second surface 135 that is opposite the first surface 133. Energy is delivered to a plasma formed in a processing region 110 of a chamber, which may be from either the RF power supply 181 or the DC power supply 182 to the target 132. The RF power may be applied to the tungsten target at a power level within the range from about 1 kW to about 2.5 kW, such as about 1.5 kW. The DC power may be applied to the tungsten target at a power level within the range from about 1 kW to about 2.5 kW, such as about 1.5 kW or 2.0 kW. Although FIG. 4A shows both an RF and DC power source coupled to the target, the chamber may have only one power source type coupled to the tungsten target in some embodiments. In some embodiments, the process of forming a thin tungsten film having low resistivity will use only a DC power source coupled to the tungsten target along with an RF bias coupled to the substrate support. In other embodiments, the process of forming a thin tungsten film will only use an RF power source coupled to the tungsten target along with an RT bias coupled to the substrate support.

A magnetron 189 may rotate about the center point of the target 132, wherein the magnetron 189 is disposed adjacent the second surface 135 of the target 132. The magnetron 189 may include an outer pole 424 comprising a plurality of magnets 423 and an inner pole 425 comprising a plurality of magnets 423. The outer and inner poles 424, 425 may form a closed-loop magnetron assembly, wherein the ratio of the magnetic fields generated by the outer and inner poles is between about 1.56 and about 0.57. The magnetron and resulting magnetic fields affect the bombardment of the tungsten ions during the deposition process, and enables control of the thin film properties such as grain size and film density. In one embodiment, the processing chamber 100 is a short throw chamber where the spacing between the target and the substrate is from a range between 55 mm and 75 mm, for example 73 mm or 65 mm. The plasma may be ignited with a non-reactive gas such as Ar or Kr. In one embodiment, a plasma may be generated from an Ar gas having a flow rate within a range from about 35 sccm to about 75 sccm. For example, the non-reactive gas flow rate may be about 70 sccm, about 65 sccm, about 60 sccm, or about 40 sccm.

The process may also include heating the substrate support 126 in the chamber. The substrate or substrate support may be heated to a temperature within a range from about 200° C. to about 900° C. In one embodiment the substrate or substrate support may be heated to a temperature within a range from about 250° C. to about 400 250° C. For example, the substrate or substrate support may be heated to 250° C., 300° C., 350° C., or even 400° C. In some embodiments, the process may lack backside gas applied to the backside of the substrate during tungsten deposition. Backside gas may be used to aid in modifying the temperature profile of the substrate during processing. However, experiments have indicated that the resistivity of tungsten is lowered when no backside gas is used. It is believed that the backside gas may affect the electrical coupling of the substrate to the substrate support, the temperature profile of the substrate, or both, and thus not having the backside gas further affects and changes the properties of the tungsten film during deposition. The process may also include pressurizing the processing region 110 of the chamber to a pressure within a range from about 1.0 mTorr to about 10.0 mTorr, for example, 4.5 mTorr. In one embodiment, the processing region 110 is pressurized such that the plasma forms a capacitively coupled plasma (CCP plasma).

During the process 208, an RF bias may be applied to the substrate via the substrate support with an RF power supply. The RF bias may have a power level within a range from about 100 W to about 800 W. In one embodiment, the RF bias may have a power level within a range from about 200 W to 400 W. For example, the RF bias may have a power level of 100 W, 200 W, 300 W, or 400 W. The substrate bias may help to control step coverage and re-sputtering to optimize morphology of the deposited tungsten. The RF bias also helps to control bombardment of the ions on the substrate, thereby affecting the thin film properties such as grain size, film density, and other properties. RF bias provides extra kinetic energy to the tungsten ions, which may prompt large grain growth. In some embodiments, the frequency of the RF bias will be less than the frequency of the RF power source coupled to the target. For example, in some embodiments, the RF bias frequency may be 2 MHz while the RF power source frequency may be 13.56 MHz. In another embodiment, the RF bias frequency may be about 13.56 MHz and the RF power source frequency may be about 60 MHz. Generally, when using a combination of RF power and RF bias, the RF frequencies of each should avoid reactive energies between the target and the substrate support.

By using the various variables described above, a tungsten film may be deposited on a substrate 105 positioned on the substrate support 126 in the chamber 100. The tungsten film may be deposited at 370 Å per minute and may be 500 Å thick. The tungsten film stress can be compressive or tensile and modulated with target power, pressure, and temperature. For example, the tungsten film stress may be in a range from about −745.00 MPa to about 1730 MPa. In one embodiment, the tungsten film stress may be tensile in the range from about 1650.00 to about 1660.00 MPA. In another embodiment, the tungsten film stress may be compressive at −743.00 MPa.

It has been found that by controlling the deposition temperature, the RF bias, and the bombardment of tungsten ions onto the substrate, a thin tungsten film may be formed having a resistance less than 10.0 μohms-cm. For example, the tungsten film resistance may be less than 9.5 μohms-cm. In some embodiments, the tungsten film resistance may be as low as 9.20 or 9.15 μohms-cm. In some embodiments. The tungsten film resistance may be less than 9.00 μohms-cm. When the silicon-containing layer is silicon, an interfacial layer of tungsten silicide between the silicon film layer and tungsten film layer may form during deposition of the tungsten film. Thus, the gate electrode stack may comprise a silicon layer on a refractory metal nitride layer, a tungsten silicide film layer on the silicon layer, and a tungsten film layer on the tungsten silicide film layer.

It is believed that controlling the various deposition parameters above helps to control grain size, grain boundaries (film density), and surface roughness which may lead to lower resistivity of thin film tungsten. Additionally, trapped gases from neutrals in the PVD chamber, such as Ar, or Kr, and even trapped oxygen can also lead to high resistivity of a deposited thin film. Additionally, the trapping of electrons may become significant during thin film deposition which also affects resistivity. Thus, adjusting the grain size, the film density and using low flow non-reactive gas, e.g. Ar, may lead to lower resistivity. Increasing the density and the grain size to form larger grains may account for the lower resistivity of thin film tungsten due to less grain boundary electron scattering.

Bulk tungsten that may be refined at temperatures above its melting point of 3422° C. may have resistivity properties of 5.5 μohms-cm or less, and thereby form proper grain sizes and boundaries to reduce resistivity. However, the temperature of thin film deposition is generally limited and thus other factors may be necessary to affect grain size growth.

Enhanced ionization of tungsten may be achieved by using RF bias, increased pressure ranges to form CCP plasma, and increased power to the target, along with deposition temperature control. Improved ionization will enhance ion bombardment, thereby providing improved tungsten grain growth, grain size, and film density. Temperature also affects the grain size and the film density, but it may need to be balanced, as increasing temperature increases the grain size but decreases the film density. Lowering the temperature thus provides more dense film. However, by using the other variables to aid in controlling grain growth and film density, the thin film properties may be less sensitive to the temperature component thereby opening up the process window.

Further, the ion bombardment may also be improved using a magnetron assembly with imbalanced ratios within a certain range, and particularly when the imbalanced ratio has a greater magnetic field strength on the inner magnetic loop compared to the outer magnetic loop. Additionally, the thickness uniformity is improved by adjusting the magnetron imbalanced ratio. Improved ion bombardment may also provide less trapping or incorporation of Ar, $O_2$, etc. into the thin film, which also reduces the resistivity of the thin tungsten film.

The overall reduced sheet resistance of the gate electrode stack may also be enhanced by the effects of growing a tungsten thin film on the silicon-containing layer. The silicon-containing layer may have an effect on the 200 plane of the tungsten crystal orientation, which may explain one possible reason why tungsten deposited on silicon provides a better resistivity. X-ray diffraction rocking curve analysis of tungsten gate electrode stacks shows that the tungsten crystal orientation is reduced along the 200 plane when a silicon layer is interposed between the tungsten layer and a titanium nitride layer compared to a similar gate electrode stack without the silicon layer.

Platforms

Formation of the gate electrode stack subsequent to the gate dielectric layer formation and conductive film layer formation may be performed in a processing system, such as the cluster tool 300 illustrated FIG. 3. Cluster tool 300 may be a dual buffer chamber, multiple process chamber semiconductor processing tool or dual buffer chamber cluster tool. The cluster tool 300 may be an Endura® platform having various attached chambers available from Applied Materials, Inc., located in Santa Clara, Calif. Attached to the cluster tool 300 may be a factory interface (FI) 330 with one or more FOUPS 332 for handling and transporting substrates from one area of a semiconductor fab to another area. The FI 330 removes substrates 358 from the FOUPS 332 to begin the processing sequence. The cluster tool 300 has a first buffer chamber 346 and a second buffer chamber 350, and a first substrate transfer location 314 and a second substrate transfer location 316 disposed within a polygonal structure 344. The first buffer chamber 346 may be a low quality vacuum buffer and the second buffer chamber 350 may be a high quality vacuum. The substrate transfer locations may be a chamber.

A first and second load lock chamber 326 and 328 may be disposed on the one side of the polygonal structure 344. A first and second degas chamber 318 and 320 may be disposed on generally opposite sides of the polygonal structure and adjacent first and second load lock chambers 326, 328. A first pair of process chambers 302 and 304 may be disposed on generally opposite sides of the polygonal structure 344 and adjacent degas chambers 318 and 320 and buffer chamber 346. The first pair of process chamber 302, 304 may be a Versa™ W PVD chamber for forming a tungsten film on the substrate, available from Applied Materials, Inc., located in Santa, Clara, Calif. A second pair of process chambers 306 and 308 may be disposed on generally opposite sides of the polygonal structure 344 and adjacent buffer chamber 350. The second pair of process chambers may be a Falcon TTN PVD chamber, also available from Applied Materials, Inc., located in Santa Clara, Calif. A third pair of process chambers 310 and 312 may be disposed on generally opposite sides of the polygonal structure 344 and adjacent second pair of process chambers 306, 308 and buffer chamber 350. The third pair of process chambers may be chambers for depositing the silicon-containing layer, also available from Applied Materials, Inc., located in Santa Clara, Calif.

All process and load lock chambers are selectively isolated from the buffer chambers 346 and 350 by plurality of slit valves (not shown) creating a first and second environment, 374 and 376, respectively. The polygonal structure 344 has a central wall 342 which separates buffer chambers 346 and 350. The central wall 342 separates the buffer chambers 346 and 350. The substrate transfer locations 314 and 316 provide individual passage though the central wall 342 to the buffer chambers 346 and 350. The substrate transfer locations 314 and 316 are selectively isolated from adjoining buffer chambers 346 and 350 by a plurality of slit valves (not shown). For example, one slit valve may be provided between first buffer chamber 346 and the first transfer chamber 314, one additional slit valve may be provided between first transfer chamber 314 and second buffer chamber 350, one slit valve may be provided between first buffer chamber 346 and second transfer chamber 316 and one slit valve may be provided between second buffer chamber 350 and second transfer chamber 316. The use of the slit valves allows for the pressure in each chamber to be individually controlled. Each substrate transfer location 314 and 316 additionally may have a substrate pedestal (not shown), respectively, for supporting the substrate in the chamber.

The first buffer chamber 346 is circumscribed by the load lock chambers 326 and 328, degas chambers 318, 320, process chambers 302 and 304, and substrate transfer locations 314 and 316. Each of the process chambers 302, 304, degas chambers 318, 320, and the load lock chambers 326, 328 are selectively isolated from the buffer chamber 346 by a slit valve (not shown). Located within buffer chamber 346 is a first robotic substrate transport mechanism 348, e.g., a multi-blade robot. Other types of transport mechanisms may be substituted. The first robotic substrate transport mechanism 348 shown may have substrate transport blades 360 supporting substrates 358. The blades 360 are used by first robotic substrate transport mechanism 348 for carrying the individual substrates 358 to and from the chambers circumscribing the first buffer chamber 346.

The second buffer chamber 350 is circumscribed by the process chambers 306, 308, 310 and 312, and substrate transfer locations 314 and 316. Located within buffer chamber 350 is a second robotic substrate transport mechanism 352, e.g., a multi-blade robot. Other types of transport mechanisms may be substituted. The second robotic substrate transport mechanism 352 shown may have substrate transport blades 360 supporting substrates 358. The blade 360 is used by second robotic substrate transport mechanism 352 for carrying the individual substrates to and from the chambers circumscribing the second buffer chamber 350.

The buffer chambers 346, 350 may have vacuum ports connected to a pumping mechanism (not shown) such as a turbo molecular pump, which is capable of evacuating the environments of chambers 346 and 350. The configuration and location of the vacuum ports may vary dependent on design criteria for individual systems.

Substrate processing, for example, may begin with the buffer chambers 346 and 350 being pumped down to a vacuum condition by a pumping mechanism. The first robotic substrate transport mechanism 348 retrieves a substrate 358 from one of the load lock chambers (e.g. 326) and carries that substrate to the first stage of processing, for example, the degas chamber 318 which may be used to degas the substrate 358 including structures formed thereon in preparation for subsequent processing. For example, the substrate 30 including the conductive film layer 26B of the gate electrode stack 25B may be degassed prior to formation of the remaining layers of the gate electrode.

In a next stage of processing, the substrate may be carried to any of the process chambers 306, 308 to perform the process 204 on the substrate as described above. Once the first robotic substrate transport mechanism 348 is no longer carrying a substrate, the first robotic substrate transport mechanism 348 can tend substrates in the other chambers surrounding buffer chamber 346. Once the substrate is processed and PVD stage deposits material upon the substrate, the substrate can then be moved to a second stage of processing, and so on. For example, the substrate may then be moved to any of processing chambers 310, 312 to perform process 206 as described above, followed by moving the substrate to any or process chamber 302, 304 to perform process 208 as described above.

If the required processing chamber is located adjacent to second buffer chamber 350, then the substrate must be transported into one of the substrate transfer locations (e.g. 314). The slit valve separating buffer chamber 346 and substrate transfer location 314 is opened. The first robotic substrate transport mechanism 348 transports the substrate into the substrate transfer location 314. The substrate transport blade 360 connected to first robotic substrate transport mechanism 348 is removed from substrate transfer location 314 leaving the substrate on the pedestal. After the slit valve separating the buffer chamber 346 and the substrate transfer location 314 is closed, a second slit valve separating the buffer chamber 350 and the substrate transfer location 314 is opened, allowing the substrate transport blade 360 connected to the second robotic substrate transport mechanism 352 to be inserted into substrate transfer location 314 to retrieve the substrate. Once the substrate is inside buffer chamber 350, the second slit valve is closed and the second robotic substrate transport mechanism 352 is free to move the substrate to the desired processing chamber or sequence of chambers serviced by buffer chamber 350 and second robotic substrate transport mechanism 352.

After substrate processing is complete, the substrate is loaded into a FOUP 332 on the FI 330, moving the substrate back through the substrate transfer location when necessary.

Tungsten PVD Chamber

FIG. 4A illustrates an exemplary semiconductor processing chamber 100 having an upper process assembly 108, a process kit 150 and a pedestal assembly 120, which are all configured to process a substrate 105 disposed in a processing region 110. The semiconductor processing chamber 100 may be a tungsten PVD deposition chamber such as processing chamber 302 or 304 on cluster tool 300 shown in FIG. 3A. The process kit 150 includes a one-piece grounded shield 160, a lower process kit 165, and an isolator ring assembly 180. In the version shown, the processing chamber 100 comprises a sputtering chamber, also called a physical vapor deposition or PVD chamber, capable of depositing a single material from a target 132 on the substrate 105. The processing chamber 100 may also be used to deposit tungsten. It is contemplated that other processing chambers including those from other manufacturers may be adapted to benefit from one or more of the embodiments of the invention described herein.

The processing chamber 100 includes a chamber body 101 having sidewalls 104, a bottom wall 106, and an upper process assembly 108 that enclose a processing region 110 or plasma zone. The chamber body 101 is typically fabricated from welded plates of stainless steel or a unitary block of aluminum. In one embodiment, the sidewalls comprise aluminum and the bottom wall comprises stainless steel plate. The sidewalls 104 generally contain a slit valve (not shown) to provide for entry and egress of a substrate 105 from the processing chamber 100. Components in the upper process assembly 108 of the processing chamber 100 in cooperation with the grounded shield 160, pedestal assembly 120 and cover ring 170 confine the plasma formed in the processing region 110 to the region above the substrate 105.

A pedestal assembly 120 is supported from the bottom wall 106 of the chamber 100. The pedestal assembly 120 supports a deposition ring 502 along with the substrate 105 during processing. The pedestal assembly 120 is coupled to the bottom wall 106 of the chamber 100 by a lift mechanism 122, which is configured to move the pedestal assembly 120 between an upper processing position and lower transfer position. Additionally, in the lower transfer position, lift pins 123 are moved through the pedestal assembly 120 to position the substrate a distance from the pedestal assembly 120 to facilitate the exchange of the substrate with a substrate transfer mechanism disposed exterior to the processing chamber 100, such as a single blade robot (not shown). A bellows 124 is typically disposed between the pedestal assembly 120 and the chamber bottom wall 106 to isolate the processing region 110 from the interior of the pedestal assembly 120 and the exterior of the chamber.

The pedestal assembly 120 generally includes a support 126 sealingly coupled to a platform housing 128. The platform housing 128 is typically fabricated from a metallic material such as stainless steel or aluminum. A cooling plate (not shown) is generally disposed within the platform housing 128 to thermally regulate the support 126. One pedestal assembly 120 that may be adapted to benefit from the embodiments described herein is described in U.S. Pat. No. 5,507,499, issued Apr. 16, 1996 to Davenport et al. which is incorporated herein by reference in its entirety.

The support 126 may be comprised of aluminum or ceramic. The substrate support 126 has a substrate receiving surface 127 that receives and supports the substrate 105 during processing, the substrate receiving surface 127 being substantially parallel to a sputtering surface (e.g. first surface 133) of the target 132. The support 126 also has a peripheral edge 129 that terminates before an overhanging edge 105A of the substrate 105. The support 126 may be an electrostatic chuck, a ceramic body, a heater or a combination thereof. In one embodiment, the support 126 is an electrostatic chuck that includes a dielectric body having a conductive layer, or electrode 126A, embedded therein. The dielectric body is typically fabricated from a high thermal conductivity dielectric material such as pyrolytic boron nitride, aluminum nitride, silicon nitride, alumina or an equivalent material. Other aspects of the pedestal assembly 120 and support 126 are further described below. In one embodiment, the conductive layer 126A is configured so that when a DC voltage is applied to the conductive layer 126A, by an electrostatic chuck power supply 143, a substrate 105 disposed on the substrate receiving surface 127 will be electrostatically chucked thereto to improve the heat transfer between the substrate 105 and the support 126. In another embodiment, an RF bias controller 141 is also coupled to the conductive layer 126A so that a voltage can be maintained on the substrate during processing to affect the plasma interaction with the surface of the substrate 105.

The chamber 100 is controlled by a system controller 190 that is generally designed to facilitate the control and automation of the processing chamber 100 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and support hardware (e.g., sensors, robots, motors, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 190 determines which tasks are performable on a substrate. Preferably, the program is software readable by the system controller 190 that includes code to perform tasks relating to monitoring, execution and control of the movement and various process recipe tasks and recipe steps being performed in the processing chamber 100. For example, the controller 190 can comprise program code that includes a substrate positioning instruction set to operate the pedestal assembly 120; a gas flow control instruction set to operate gas flow control valves to set a flow of sputtering gas to the chamber 100; a gas pressure control instruction set to operate a throttle valve or gate valve to maintain a pressure in the chamber 100; a temperature control instruction set to control a temperature control system (not shown) in the pedestal assembly 120 or sidewalls 104 to set temperatures of the substrate or sidewalls 104, respectively; and a process monitoring instruction set to monitor the process in the chamber 100.

The chamber 100 also contains a process kit 150 which comprises various components that can be easily removed from the chamber 100, for example, to clean sputtering deposits off the component surfaces, replace or repair eroded components, or to adapt the chamber 100 for other processes. In one embodiment, the process kit 150 comprises an isolator ring assembly 180, a grounded shield 160 and a ring assembly 168 for placement about a peripheral edge 129 of the support 126 that terminates before an overhanging edge of the substrate 105.

Figure 4B:
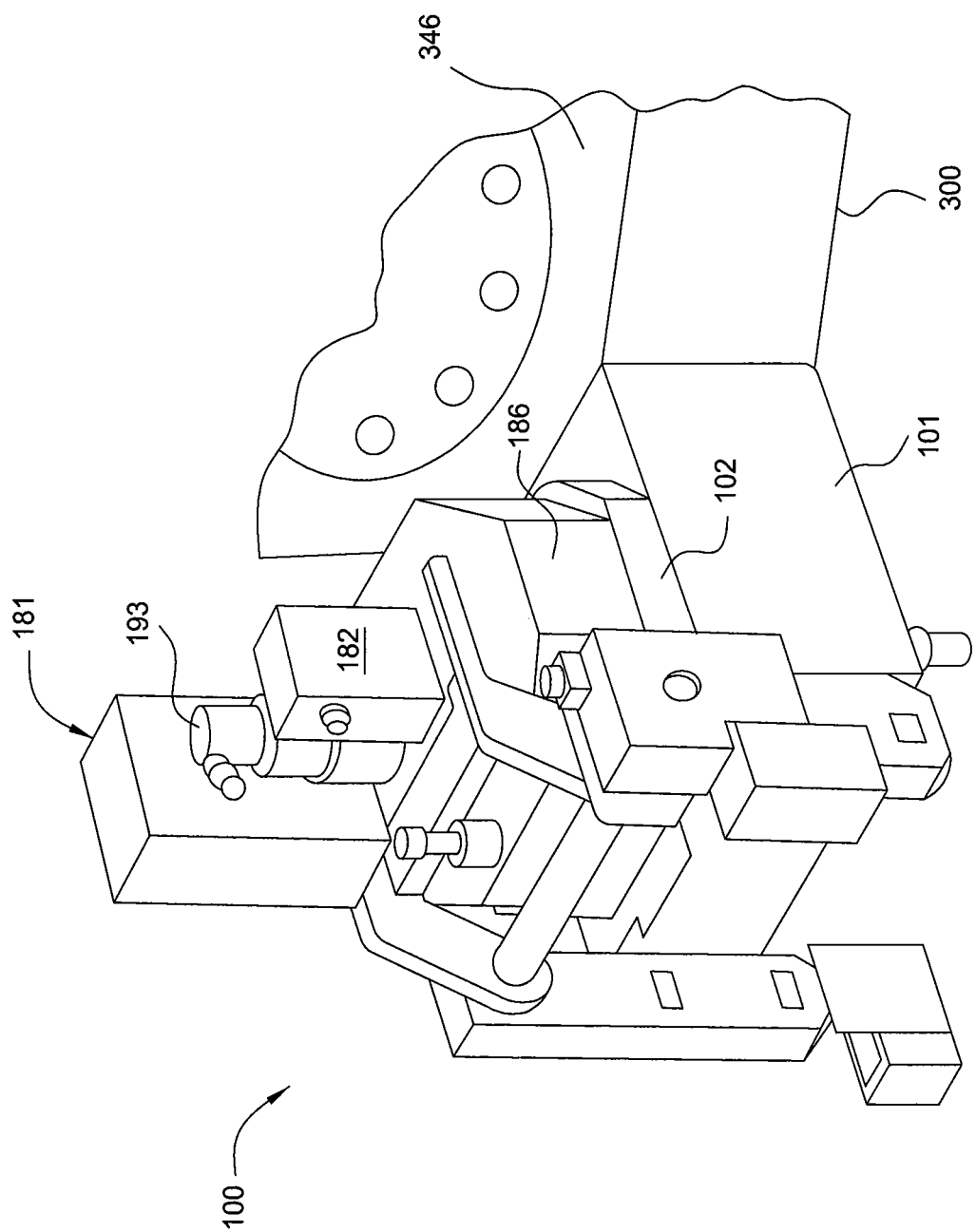
FIG. 4B depicts an isometric view of a chamber according to one embodiment of the invention.

FIG. 4B is an isometric view of the processing chamber 100 that is coupled to a processing position of a cluster tool 300. The cluster tool 300 may also contain other processing chambers such as shown in FIG. 3 that are adapted to perform one or more processing steps on a substrate prior to or after performing the deposition process in the processing chamber 100. An exemplary cluster tool 300 may include a Centura® or an Endura® system available from Applied Materials, Inc., Santa Clara, Calif. In one example, the cluster tool 300 may have processing chambers that are configured to perform a number of substrate processing operations such as cyclical layer deposition, chemical vapor deposition (CVD), physical vapor deposition (PVD), atomic layer deposition (ALD), etch, pre-clean, degas, anneal, orientation and other substrate processes. A transfer tool, for example, a robot 348 disposed in the transfer chamber 346, may be used to transfer substrates to and from one or more chambers attached to the cluster tool 300.

The upper process assembly 108 may also comprise an RF power supply 181, a direct current (DC) power supply 182, an adaptor 102, a motor 193, and a lid assembly 130. The lid assembly 130 generally comprises a target 132, a magnetron 189 and a lid enclosure 191. The upper process assembly 108 is supported by the sidewalls 104 when in a closed position, as shown in FIGS. 4A and 4B. A ceramic target isolator 136 is disposed between the isolator ring assembly 180, the target 132 and adaptor 102 of the lid assembly 130 to prevent vacuum leakage therebetween. The adaptor 102 is sealably coupled to the sidewalls 104, and is configured to help with the removal of the upper process assembly 108 and isolator ring assembly 180.

When in the processing position, the target 132 is disposed adjacent to the adaptor 102, and is exposed to the processing region 110 of the processing chamber 100. The target 132 contains material that is deposited on the substrate 105 during a PVD, or sputtering, process. The isolator ring assembly 180 is disposed between the target 132 and the shield 160 and chamber body 101 to electrically isolate the target 132 from the shield 160 and chamber body 101.

During processing, the target 132 is biased relative to a grounded region of the processing chamber (e.g., chamber body 101 and adaptor 102) by a power source disposed in the RF power supply 181 and/or the direct current (DC) power supply 182. In one embodiment, the RF power supply 181 comprises an RF power power supply 181A and an RF match 181B that are configured to efficiently deliver RF energy to the target 132. In one example, the RF power supply 181A is capable of generating RF currents at a frequency of between about 13.56 MHz and about 60 MHz at powers between about 0 and about 4.5 kW. In one example, the DC power supply 182A in the DC power supply 182 is capable of delivering between about 0 and about 2.5 kW of DC power. In another example, the RF power supply 181A is capable of generating an RF power density of between about 15 and about 45 kW/m$^2$ at the target and the DC power supply 182 is capable of delivering a power density of between about 15 and about 45 kW/m$^2$.

During processing, a gas, such as argon, is supplied to the processing region 110 from a gas source 142 via conduits 144. The gas source 142 may comprise a non-reactive gas such as argon, krypton, helium or xenon, which is capable of energetically impinging upon and sputtering material from the target 132. The gas source 142 may also include a reactive gas, such as one or more of an oxygen-containing gas or a nitrogen-containing gas, which is capable of reacting with the sputtering material to form a layer on a substrate. Spent process gas and byproducts are exhausted from the chamber 100 through exhaust ports 146 that receive spent process gas and direct the spent process gas to an exhaust conduit 148 having an adjustable position gate valve 147 to control the pressure in the processing region 110 in the chamber 100. The exhaust conduit 148 is connected to one or more exhaust pump 149, such as a cryopump. Typically, the pressure of the sputtering gas in the chamber 100 during processing is set to sub-atmospheric levels, such as a vacuum environment, for example, a pressure of about 1.0 mTorr to about 10.0 mTorr. In one embodiment, the processing pressure is set to about 2.5 mTorr to about 6.5 mTorr. A plasma is formed between the substrate 105 and the target 132 from the gas. Ions within the plasma are accelerated toward the target 132 and cause material to become dislodged from the target 132. The dislodged target material is deposited on the substrate.

The lid enclosure 191 generally comprises a conductive wall 185, a center feed 184 and shielding 186 (FIGS. 4A and 4B). In this configuration, the conductive wall 185, the center feed 184, the target 132 and a portion of the motor 193 enclose and form a back region 134. The back region 134 is a sealed region disposed on the back side of the target 132 and is generally filled with a flowing liquid during processing to remove the heat generated at the target 132 during processing. In one embodiment, the conductive wall 185 and center feed 184 are configured to support the motor 193 and magnetron system 189, so that the motor 193 can rotate the magnetron system 189 during processing. In one embodiment the motor 193 is electrically isolated from the RF or DC power delivered from the power supplies by use of a dielectric layer such as Delrin, G10, or Ardel.

The shielding 186 may comprise one or more dielectric materials that are positioned to enclose and prevent the RF energy delivered to the target 132 from interfering with and affecting other processing chambers disposed in the cluster tool 103 (FIG. 4B). In one configuration, the shielding 186 may comprise a Delrin, G10, Ardel or other similar material and/or a thin grounded sheet metal RF shield.

Figure 6:
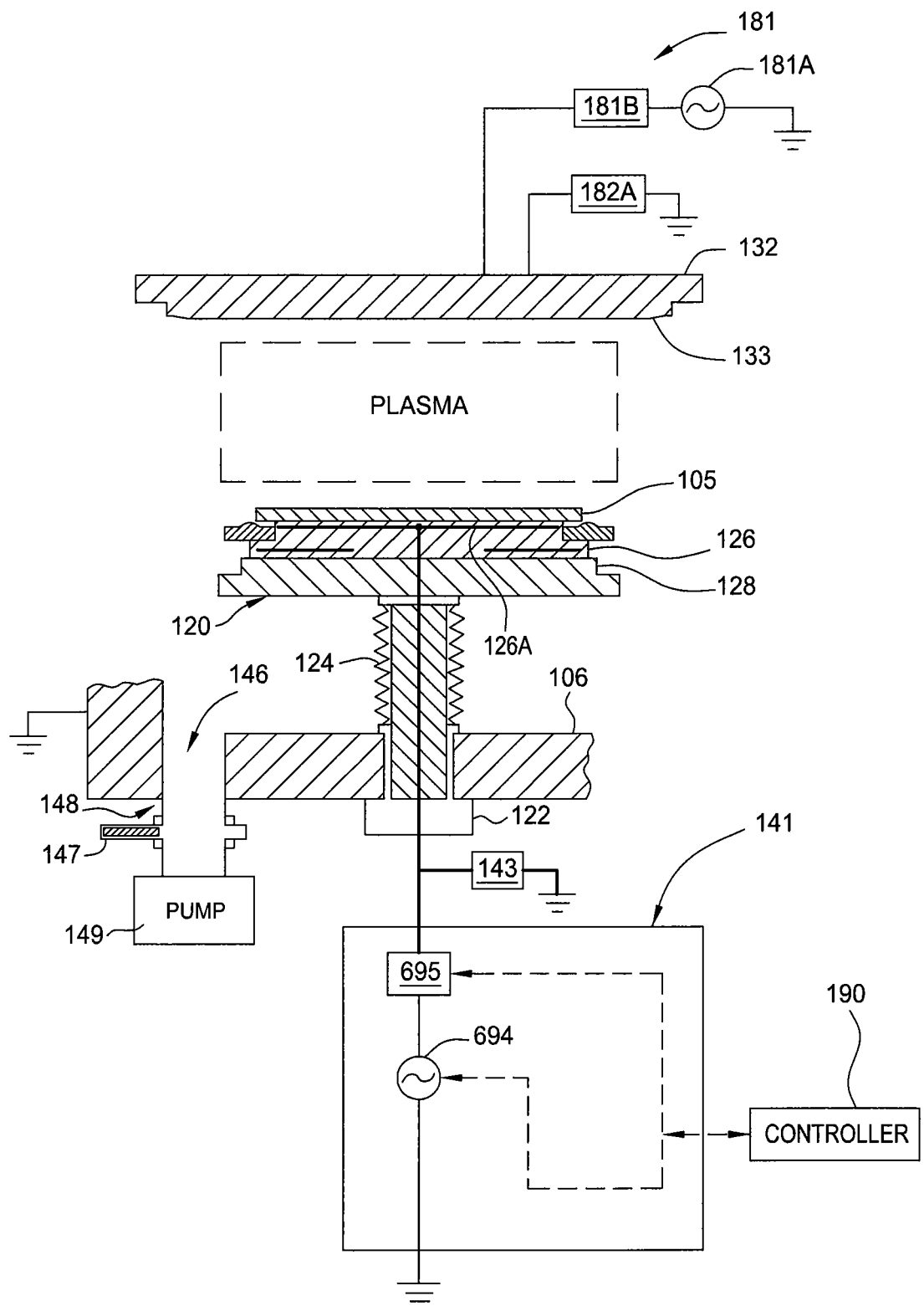
FIG. 6 illustrates a schematic view of an impedance controller according to one embodiment of the invention.

In one embodiment of the processing chamber 100, an RF bias controller 141 (FIG. 4A, 6) is coupled between an electrode and RF ground to adjust the bias voltage on the substrate during processing to control the degree of bombardment on the substrate surface. In one embodiment, the electrode is disposed adjacent to the substrate receiving surface 127 of a support 126, and comprises the electrode 126A. In a PVD reactor, tuning of the bombardment of the substrate surface by the control of the impedance of the electrode to ground, will affect the deposited film's properties, such as grain size, film stress, crystal orientation, film density, roughness and film composition. Therefore, the RF bias controller 141 can thus be used to alter the film properties at the substrate surface. FIG. 6 illustrates one embodiment of the RF bias controller 141 that has an RF power source 694 and an RF match 695. The RF bias power set point can depend on the desired processing results to be achieved on the substrate.

Lower Process Kit and Substrate Support Assembly

Figure 5:
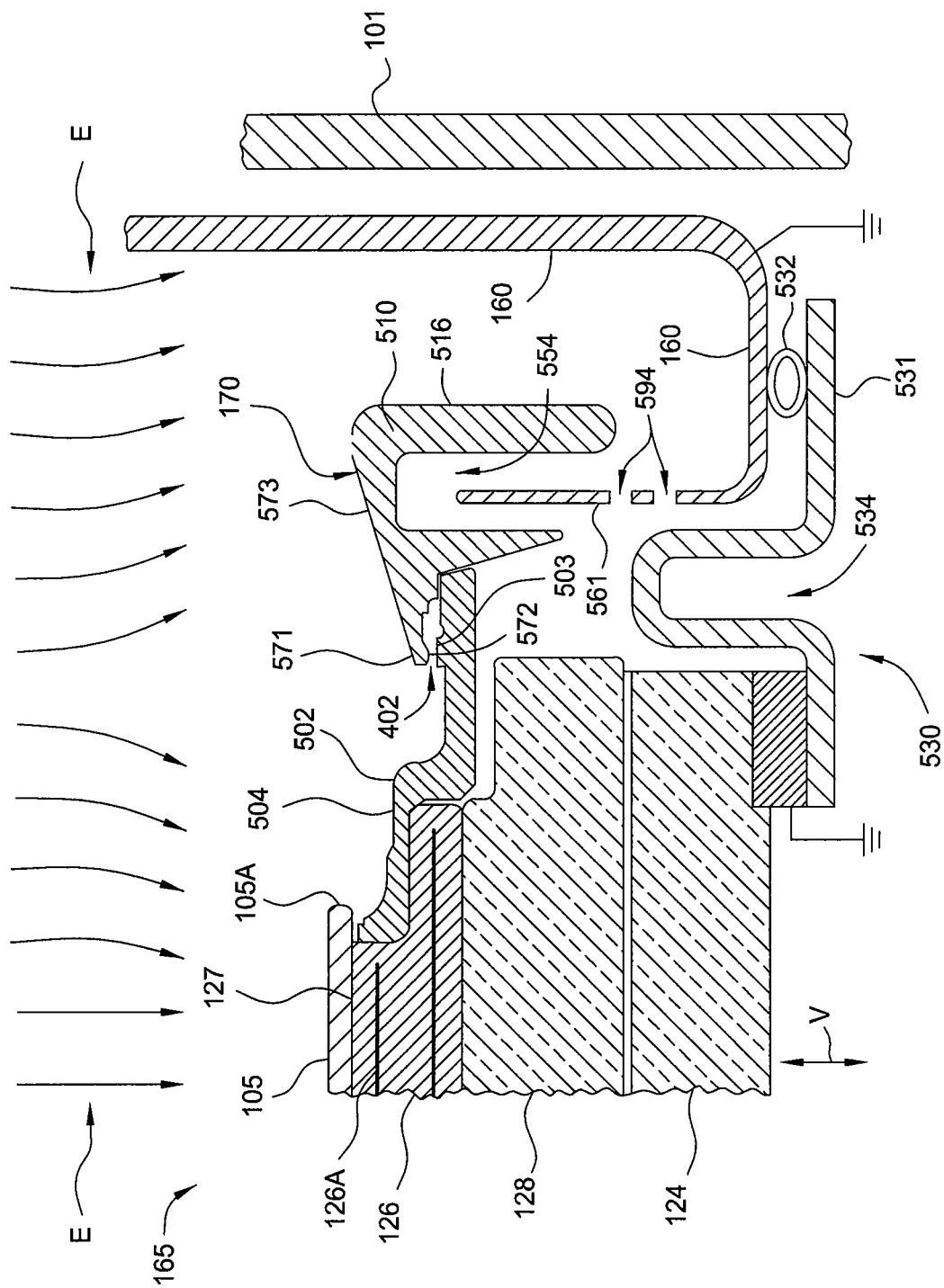
FIG. 5 illustrates a cross-sectional view of a portion of a process kit according to one embodiment of the invention.

Referring to FIGS. 4A and 5, the lower process kit 165 comprises a deposition ring 502 and a cover ring 170. The deposition ring 502 is generally formed in an annular shape, or annular band, surrounding the support 126. The cover ring 170 at least partially covers a portion of the deposition ring 502. During processing the deposition ring 502 and the cover ring 170 cooperate with one another to reduce formation of sputter deposits on the peripheral edges 129 of the support 126 and the overhanging edge 105A of the substrate 105.

The cover ring 170 encircles and at least partially covers the deposition ring 502 to receive, and thus, shadow the deposition ring 502 from the bulk of the sputtering deposits. The cover ring 170 is fabricated from a material that can resist erosion by the sputtering plasma, for example, a metallic material such as stainless steel, titanium or aluminum, or a ceramic material, such as aluminum oxide. In one embodiment, the cover ring 170 is formed from a stainless steel material. In one embodiment, a surface of the cover ring 170 is treated with a twin-wire aluminum arc-spray coating, such as, for example, CLEANCOAT™, to reduce particle shedding from the surface of the cover ring 170. In one embodiment, the deposition ring 502 is fabricated from a dielectric material that can resist erosion by the sputtering plasma, for example, a ceramic material, such as aluminum oxide.

The cover ring 170 comprises an annular ring 510 comprising a top surface 573 that is sloped radially inwards and encircles the support 126. The top surface 573 of the annular ring 510 has an inner periphery 571 and an outer periphery 516. The inner periphery 571 comprises a projecting brim 572 which overlies the radially inward dip comprising an open inner channel of the deposition ring 502. The projecting brim 572 reduces deposition of sputtering deposits on the open inner channel disposed between the surface 503 of the deposition ring 502 and the projecting brim 572. The projecting brim 572 is sized, shaped, and positioned to cooperate with and complement the arc-shaped gap 402 to form a convoluted and constricted flow path between the cover ring 170 and deposition ring 502 that inhibits the flow of process deposits onto the support 126 and the platform housing 128.

The top surface 573 may be inclined at an angle of between about 10 degrees and about 20 degrees from the horizontal. The angle of the top surface 573 of the cover ring 170 is designed to minimize the buildup of sputter deposits nearest to the overhanging edge of the substrate 105, which would otherwise negatively impact the particle performance obtained across the substrate 105. The cover ring may comprise any material that is compatible with process chemistries such as titanium or stainless steel.

The space or gap 554 between the ring support portion 561 of the shield 160 and the cover ring 170 forms a convoluted S-shaped pathway or labyrinth for plasma to travel. The shape of the pathway is advantageous, for example, because it hinders and impedes ingress of plasma species into this region, reducing undesirable deposition of sputtered material. In some embodiments, the grounded shield 160 may also be heated. A plurality of apertures 594 may be formed along the shield for gas flow between the processing region and the lower portions of the chamber i.e. Ar flowing into the processing region 110 for impinging the target 132. The size of the apertures 594 may be adjusted also to prevent plasma leakage into the region below the substrate assembly. If the apertures 594 are too small, the conductance may be too poor, so the apertures size may need to be adjusted to minimize RF leakage. In one embodiment, the pedestal grounding assembly 530 comprises a plate 531 that has a U-shaped portion 534. The U-shaped portion 534 extends between the substrate support assembly and the ring support portion 561 of the grounded shield 160. The U-shaped portion 534 helps prevent an electrical potential between the bias on the substrate support and the pedestal grounding assembly 530, preventing plasma from forming in that region. Thus, the U-shaped portion 534 may create a region of dark space to prevent plasma igniting in the region beneath the lower process kit 165 and the substrate support assembly.

In one embodiment, as shown in FIG. 5, the cover ring 170 is designed and positioned relative to the grounded shield 160 during processing, so that will not be in contact with the grounded shield, and thus will electrically "float". Further, in one embodiment, it is desirable to position the cover ring 170 and deposition ring 502 so that they are a distance from the substrate 105 and below the substrate receiving surface 127 of the support 126 to allow the electric field "E" created by the delivery of RF and/or DC power to the target 132 to be more uniform across the surface of the substrate during processing.

It should be noted that while the discussion herein and illustrations in FIGS. 4A-6 all describe the substrate receiving surface 127 as being positioned below the target 132, and the cover ring 170 and deposition ring 502 being below the substrate receiving surface 127, this vertically oriented configuration is not intended to be limiting as to the scope of the invention described herein, and is only used as a reference frame to define the relative order and/or distances of each of the components to one another. In some embodiments, the substrate receiving surface 127 can be positioned in other orientations relative to the target 132 (e.g., above, horizontally aligned), while the cover ring 170 and deposition ring 502 are still disposed a distance further from the target 132 than the substrate receiving surface 127 is from the target 132.

In another embodiment, it is desirable to assure that a deposited film layer formed on the upper surfaces 504 of the deposition ring 502, which is formed from a dielectric material, does not have an electric path to ground to prevent the electric field in the region near the edge 105A of the substrate from varying over time (e.g., process kit life). To prevent the film layers deposited on the upper surfaces 504 from making electrical contact with the shield 160 and cover ring 170, the projecting brim 572 of the cover ring 170 is sized, shaped, and positioned to prevent the deposition on the deposition ring 502 from forming a bridge with the layers deposited on the cover ring 170 and from making their way to the shield 160.

The components of the lower process kit 165 work alone and in combination to significantly reduce particle generation and stray plasmas. In comparison with existing multiple part shields, which provided an extended RF return path contributing to RF harmonics causing stray plasma outside the process cavity, the one piece shield 160 described above reduces the RF return path thus providing improved plasma containment in the interior processing region. The flat base-plate of the one piece shield provides an additional shortened return path for RF through the pedestal to further reduce harmonics and stray plasma as well as providing a landing for existing grounding hardware.

Referring again to FIG. 5, in one embodiment, the pedestal assembly 120 further comprises a pedestal grounding assembly 530 that is adapted to assure that the bellows 124 are grounded during processing. If the bellows 124 achieve a different RF potential than the shield 160 it can affect the plasma uniformity and cause arcing to occur in the processing chamber, which will affect the deposited film layer's properties, generate particles and/or affect the process uniformity. In one embodiment, the pedestal grounding assembly 530 comprises a plate 531 that contains a conductive spring 532. The conductive spring 532 and plate 531 are configured to make electrical contact with a surface of the shield 160 when the pedestal assembly 120 is moved to the processing position (shown in FIG. 5) in a direction "V" by the lift mechanism 122. The conductive spring 532 may disengage from the shield 160 when the pedestal assembly 120 is moved to the transfer position (shown in FIG. 4A) in a direction "V" by the lift mechanism 122.

Magnetron Assembly

Figure 7:
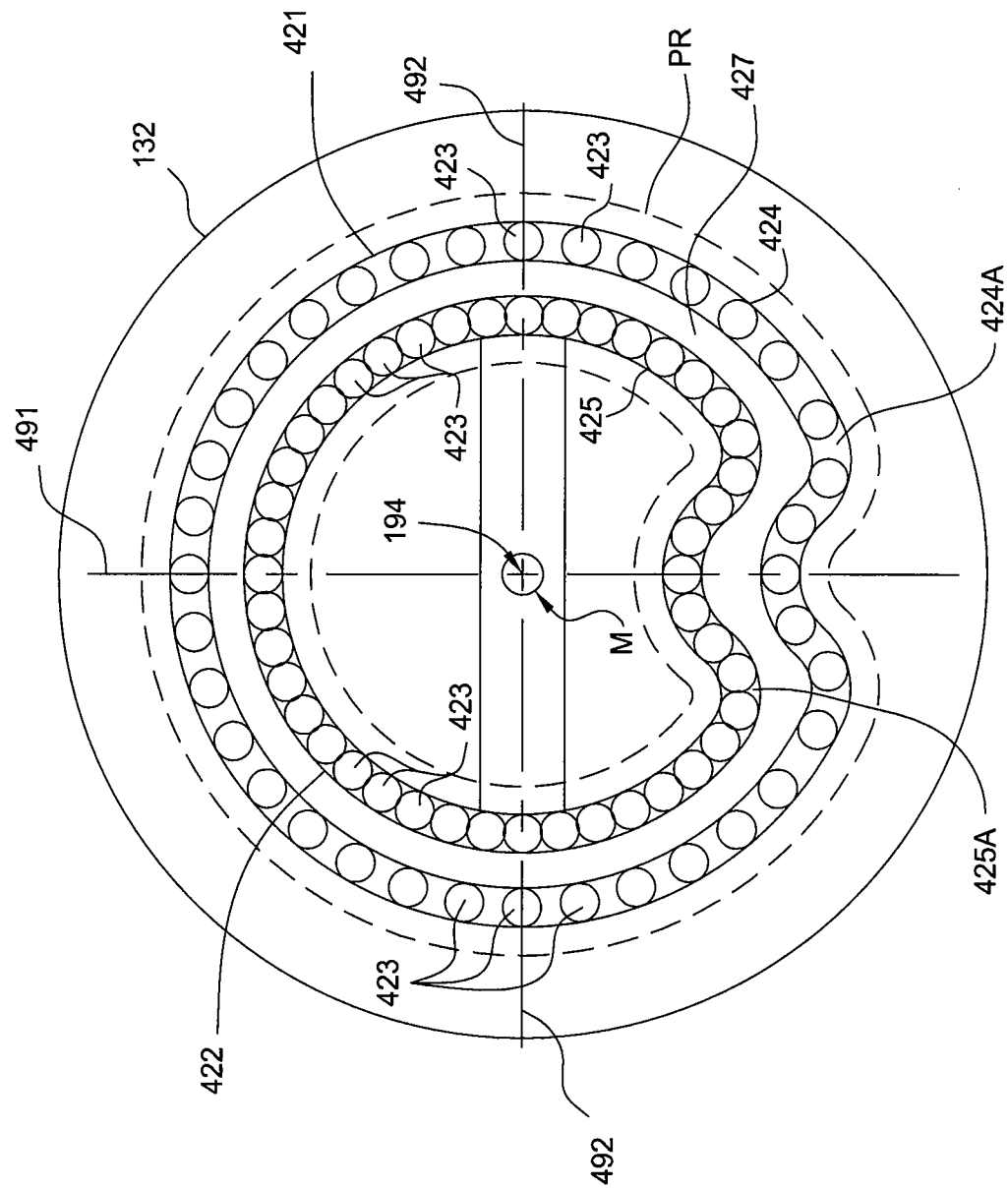
FIG. 7 illustrates a top view of a portion of the magnetron according to one embodiment of the invention.

Referring to FIGS. 4A and 7, to provide efficient sputtering, a magnetron system 189 is positioned in back of the target 132 in the upper process assembly 108 to create a magnetic field in the processing region 110 adjacent the sputtering surface 133 of the target 132. The magnetic field is created to trap electrons and ions to thereby increase the plasma density and to thereby also increase the sputtering rate. According to one embodiment of the invention, the magnetron system 189 includes a source magnetron assembly 420 that comprises a rotation plate 413, an outer pole 424 and an inner pole 425. The rotation plate 413 generally allows the positioning of the magnetic field generating components in the source magnetron assembly 420 to be moved relative to the central axis 194 of the chamber 100.

The rotation plate 413 is generally adapted to support and magnetically couple the outer pole 424 of a first magnetic polarity in the vertical direction and the inner pole 425 having a second magnetic polarity opposite to that of the first magnetic polarity. The inner pole 424 is separated from the outer pole 425 by a gap 427, and each of the poles generally comprises one or more magnets and a pole piece. The magnetic field extending between the two poles 424, 425 creates a plasma region adjacent a first portion of the sputtering face of the target 132. The plasma region forms a high density plasma region that generally follows the shape of the gap 427.

In one embodiment, as shown in FIG. 7, the magnetron system 189 is a closed loop design. In general, a "closed loop" magnetron configuration is formed such that the outer pole of the magnetron surrounds the inner pole of the magnetron forming a gap between the poles that is a continuous loop. In the closed loop configuration, the magnetic fields that emerge and reenter through a surface of the target form a "closed loop" pattern that can be used to confine electrons near the surface of the target in a closed pattern, which is often called a "racetrack" type pattern. A closed loop, as opposed to the open-loop, magnetron configuration is able to confine electrons and generate a high density plasma near the sputtering surface 133 of the target 132 to increase the sputtering yield.

In one embodiment of the magnetron system 189, a rotary shaft 193A powered by the motor 193 extends along a central axis 194 and supports the rotation plate 413 and the source magnetron assembly 420. During processing, sputtering significantly heats the target 132. Accordingly, a back region 134 is sealed to the back of the target 132 and is filled with a liquid of cooling water, which is chilled by a chiller (not shown) and water piping recirculating the cooling water (not shown). The rotary shaft 193A penetrates the back chamber 100 through a rotary seal (not shown). The magnetron system 189 is immersed in the liquid disposed in the back region 134.

In some embodiments, the source magnetron assembly 420 is an imbalanced magnetron. In one embodiment, the relative imbalance is small and thus is near a ratio of one. Typically, the imbalance is defined as the ratio of the total magnetic intensity or magnetic flux integrated over the outer pole 424 divided by the total magnetic intensity or magnetic flux integrated over the inner pole 425. It has been found that by keeping the outer to inner field strength imbalance between about 1.56 and about 0.57, the deposition process of tungsten films can be improved to increase bombardment and grain size. In one embodiment, the outer to inner field strength imbalance is a ratio of between about 1.15 and about 0.93. The magnetic imbalance causes part of the magnetic field emanating from the inner pole 425 to project towards the substrate 105 and guide ionized sputter particles to the substrate 105. However, the source magnetron assembly 420 will create a plasma that causes a sizable fraction of the sputtered particles to be ionized. The ionized particles are at least partially guided towards the substrate 105 by the imbalanced magnetic field, improving film thickness uniformity.

FIG. 7 illustrates an embodiment of the magnetron system 189 in which an outer pole 424 and an inner pole 425 form a closed loop ring magnetron that is centered about the center "M" of the target 132. In one embodiment, a radially symmetric shaped magnetron design is used that is an imbalanced and non-magnetically symmetric closed loop magnetron design that may be useful for depositing a film using an RF and/or a DC plasma.

In one embodiment, the magnets 423 disposed in the outer pole 424 and inner pole 425 are distributed symmetrically about a first axis 491 and asymmetrically distributed about a second axis 492. In one embodiment, the outer pole 424 and inner pole 425 have an outer to inner field strength imbalance between about 1.56 and about 0.57 at a point between the outer pole 424 and inner pole 425 along the first axis 491. In another embodiment of the imbalanced closed loop design, the imbalance between the outer pole 424 and inner pole 425 at a point between the outer pole 424 and inner pole 425 along the first axis 491 has a ratio between about 1.15 and about 0.93, outer to inner field strength. It is noted that the magnetic field imbalance between the inner and outer poles is different than the asymmetry of the magnets 423 relative to the second axis 492, since the imbalance relates to the fields created between the poles and the asymmetry relates to the presence, or variation in average magnetic field strength, at various regions across the surface of the target. In this configuration, an imbalanced closed loop magnetron is used to create a ring shaped plasma region "PR" that may be centered about the gap 427.

The plasma density will generally be higher in the processing region adjacent to a region of the magnetron system 189 above the second axis 492 (FIG. 7), or region having the highest density of magnets, versus a region having the lowest density of magnets, or no magnets in some embodiments. The magnetron spins on a generally central axis above the target and the chamber, and thus in one embodiment is configured to be rotated about its center "M" by the motor 193 during processing.

In one embodiment, the outer pole 424 and inner pole 425 each comprise a plurality of magnets 423 that are positioned in an array pattern on either side of the gap 427 and are capped by a pole piece. In one configuration, the north (N) poles of the magnets 423 in the outer pole 424 are positioned away from the rotation plate 413 and south (S) poles of the magnets 423 in the inner pole 425 are positioned away from the rotation plate 413. In some configurations, a magnetic yoke (not shown) is disposed between the magnets of the inner and outer poles and the rotation plate 413.

In one example, the source magnetron assembly 420 comprises an outer pole 424 that has 34 magnets contained therein and an inner pole 425 that has 60 magnets contained therein, where the magnets 423 are made from an Alnico alloy, rare-earth material, or other similar material. In another embodiment, the outer pole 424 has 56 magnets and the inner pole has 36 magnets. In another embodiment, the outer pole 424 has 56 magnets and the inner pole has 49 magnets. In yet another embodiment, the outer pole has 56 magnets and the inner pole has 60 magnets. The imbalanced ratio helps improve thickness uniformity. For example, be decreasing the imbalanced ratio to less than 1, the thickness uniformity be less than 11% difference between the maximum measured thickness and the minimum measured thickness. In some embodiments, the thickness uniformity may approach around 5.5% when the imbalance ratio is around 0.57. However, decreasing the imbalance ratio may also increase the resistivity of the deposited tungsten. Thus, the imbalanced ratio may be modified along with the other variables to provide a thin tungsten film having a resistance lower than tungsten films formed according to conventional PVD and CVD methods while maintaining good film uniformity.

While the foregoing is directed to embodiments of the invention, other and further embodiments of the invention may be devised without departing from the basic scope thereof.

What is claimed is:
1. A plasma processing chamber comprising:
  a target having a first surface that is in contact with a processing region and a second surface that is opposite the first surface;
  an RF or DC power supply coupled to the target;
  a grounded shield that at least partially encloses a portion of the processing region and is electrically coupled to a ground and thermally coupled to a heater;
  a substrate support having a substrate receiving surface disposed below the target, the substrate support further comprising an electrode disposed below the substrate receiving surface;
  a cover ring;
  a deposition ring disposed over a portion of the substrate support;
  a pedestal grounding assembly disposed below the substrate support comprising a plate having a U-shaped portion that extends between a substrate support assembly and a ring support portion of the grounded shield; and a magnetron disposed adjacent to the second surface of the target, wherein the magnetron comprises:

an outer pole comprising a plurality of magnets; and an inner pole comprising a plurality of magnets, wherein the outer and inner poles form a closed-loop magnetron assembly, wherein the outer pole and the inner pole each create a magnetic field, and wherein the ratio of the magnetic fields generated by the outer and inner poles is between about 1.56 and about 0.57.

2. The plasma processing chamber of claim 1, wherein the magnetic field created by the plurality of magnets disposed in the inner pole is greater than the magnetic field created by the plurality of magnets disposed in the outer pole.

3. The plasma processing chamber of claim 1, wherein the electrode provides an RF powered bias to the substrate support.

4. The plasma processing chamber of claim 1, wherein the grounded shield is a single piece.

5. The plasma processing chamber of claim 4, wherein the grounded shield has a plurality of apertures through the ring support portion.

6. The plasma processing chamber of claim 1, wherein the ratio of the magnetic field generated by the outer and inner poles is between about 1.15 and about 0.93.

7. The plasma processing chamber of claim 6, wherein the closed loop magnetron is centered about a center of the target.

8. The plasma processing chamber of claim 7, wherein the closed loop magnetron is radially symmetric.

9. The plasma processing chamber of claim 8, wherein the magnets of the outer pole and inner pole are symmetrically distributed about a first axis and asymmetrically distributed about a second axis.

10. The plasma processing chamber of claim 8, wherein the outer pole comprises 34 magnets and the inner pole comprises 60 magnets.

11. The plasma processing chamber of claim 1, wherein the target and the grounded shield are electrically isolated by an isolator.

12. The plasma processing chamber of claim 1, wherein the target is coupled on the second surface to a lid enclosure on the first surface to an isolator.

13. The processing chamber of claim 12, wherein the lid enclosure is filled with a liquid.

* * * * *